(12) United States Patent
Fouquet

(10) Patent No.: US 8,258,911 B2
(45) Date of Patent: Sep. 4, 2012

(54) COMPACT POWER TRANSFORMER COMPONENTS, DEVICES, SYSTEMS AND METHODS

(75) Inventor: Julie E. Fouquet, Portola Valley, CA (US)

(73) Assignee: Avago Technologies ECBU IP (Singapor) Pte. Ltd., Singapore (SG)

( * ) Notice: Subject to any disclaimer, the term of this patent is extended or adjusted under 35 U.S.C. 154(b) by 0 days.

(21) Appl. No.: 12/957,446

(22) Filed: Dec. 1, 2010

(65) Prior Publication Data
US 2011/0075449 A1    Mar. 31, 2011

Related U.S. Application Data

(63) Continuation-in-part of application No. 12/059,747, filed on Mar. 31, 2008, now Pat. No. 7,852,186, and a continuation-in-part of application No. 12/059,979, filed on Mar. 31, 2008, and a continuation-in-part of application No. 12/370,208, filed on Feb. 12, 2009, and a continuation-in-part of application No. 12/392,978, filed on Feb. 25, 2009, now Pat. No. 7,741,943, and a continuation-in-part of application No. 12/393,596, filed on Feb. 26, 2009, now Pat. No. 8,061,017, and a continuation-in-part of application No. 12/477,078, filed on Jun. 2, 2009, and a continuation-in-part of application No. 12/495,733, filed on Jun. 30, 2009, now Pat. No. 7,948,067, and a continuation-in-part of application No. 12/752,019, filed on Mar. 31, 2010, and a continuation-in-part of application No. 12/751,971, filed on Mar. 31, 2010, now Pat. No. 8,093,983.

(51) Int. Cl.
*H01F 5/00*    (2006.01)
*H01F 27/28*    (2006.01)
*H02M 3/335*    (2006.01)
*H02M 3/22*    (2006.01)
*H02M 7/60*    (2006.01)
*H02M 7/44*    (2006.01)

(52) U.S. Cl. ........ 336/200; 336/223; 336/232; 336/170; 363/21.01; 363/15; 363/82; 363/109; 363/140

(58) Field of Classification Search .......... 336/200, 336/223, 232, 170; 363/21.01, 15.82, 109, 363/140
See application file for complete search history.

(56) References Cited

U.S. PATENT DOCUMENTS
4,027,152 A    5/1977    Brown et al.
(Continued)

FOREIGN PATENT DOCUMENTS
CN    1180277    4/1998
(Continued)

OTHER PUBLICATIONS
U.S. Appl. No. 11/264,956, filed Nov. 1, 2005, Guenin et al.
(Continued)

*Primary Examiner* — Mohamad Musleh
*Assistant Examiner* — Mangtin Lian

(57) ABSTRACT

Disclosed herein are various embodiments of compact coil power transformers configured to provide high voltage isolation and high voltage breakdown performance characteristics in small packages. Compact coil transformers are provided across which power may be transmitted and received by primary and secondary coils disposed on opposing sides of a substrate without high voltage breakdowns occurring therebetween. At least portions of the compact coil transformer are formed of an electrically insulating, non-metallic, non-semiconductor, low dielectric loss material. The compact coil transformers may be formed in small packages using, by way of example, printed circuit boards, flex circuits, lead frames, CMOS and other fabrication and packaging processes.

15 Claims, 9 Drawing Sheets

U.S. PATENT DOCUMENTS

| | | | |
|---|---|---|---|
| 4,236,086 A | 11/1980 | Hoebel | |
| 4,494,100 A * | 1/1985 | Stengel et al. | 336/200 |
| 4,541,894 A | 9/1985 | Cassat | |
| 4,931,075 A | 6/1990 | Kuhn | |
| 5,015,972 A * | 5/1991 | Cygan et al. | 333/32 |
| 5,070,317 A | 12/1991 | Bhagat | |
| 5,312,674 A | 5/1994 | Haertling et al. | |
| 5,363,081 A | 11/1994 | Bando et al. | |
| 5,420,558 A | 5/1995 | Ito et al. | |
| 5,504,668 A * | 4/1996 | Beyerlein et al. | 363/95 |
| 5,597,979 A | 1/1997 | Courtney et al. | |
| 5,659,462 A | 8/1997 | Chen et al. | |
| 5,693,871 A | 12/1997 | Stout et al. | |
| 5,716,713 A | 2/1998 | Zsamboky et al. | |
| 5,754,088 A | 5/1998 | Fletcher et al. | |
| 5,768,111 A * | 6/1998 | Zaitsu | 363/15 |
| 5,825,259 A | 10/1998 | Harpham | |
| 5,952,849 A | 9/1999 | Haigh | |
| 6,167,475 A | 12/2000 | Carr | |
| 6,175,293 B1 | 1/2001 | Hasegawa et al. | |
| 6,198,374 B1 | 3/2001 | Abel | |
| 6,215,377 B1 | 4/2001 | Douriet et al. | |
| 6,255,714 B1 | 7/2001 | Kossives et al. | |
| 6,300,617 B1 | 10/2001 | Daughton et al. | |
| 6,307,457 B1 | 10/2001 | Wissink et al. | |
| 6,320,532 B1 | 11/2001 | Diede | |
| 6,404,317 B1 | 6/2002 | Mizoguchi et al. | |
| 6,476,704 B2 | 11/2002 | Goff | |
| 6,489,850 B2 | 12/2002 | Heineke et al. | |
| 6,501,364 B1 | 12/2002 | Hui et al. | |
| 6,525,566 B2 | 2/2003 | Haigh et al. | |
| 6,538,313 B1 | 3/2003 | Smith | |
| 6,545,059 B1 | 4/2003 | Fichou | |
| 6,556,117 B1 * | 4/2003 | Nakao et al. | 336/105 |
| 6,574,091 B2 | 6/2003 | Heineke et al. | |
| 6,661,079 B1 | 12/2003 | Bikulcius | |
| 6,686,825 B2 | 2/2004 | Tamezawa et al. | |
| 6,856,226 B2 | 2/2005 | Gardner | |
| 6,859,130 B2 | 2/2005 | Nakashima et al. | |
| 6,867,678 B2 | 3/2005 | Yang | |
| 6,870,456 B2 | 3/2005 | Gardner | |
| 6,873,065 B2 | 3/2005 | Haigh et al. | |
| 6,888,438 B2 | 5/2005 | Hui et al. | |
| 6,891,461 B2 | 5/2005 | Gardner | |
| 6,903,578 B2 | 6/2005 | Haigh et al. | |
| 6,919,775 B2 | 7/2005 | Wendt et al. | |
| 6,922,080 B2 | 7/2005 | Haigh et al. | |
| 6,943,658 B2 | 9/2005 | Gardner | |
| 6,944,009 B2 | 9/2005 | Nguyen et al. | |
| 6,970,040 B1 | 11/2005 | Dening | |
| 7,016,490 B2 | 3/2006 | Beutler et al. | |
| 7,064,442 B1 | 6/2006 | Lane et al. | |
| 7,170,807 B2 | 1/2007 | Franzen et al. | |
| 7,171,739 B2 | 2/2007 | Yang et al. | |
| 7,302,247 B2 | 11/2007 | Dupuis | |
| 7,376,116 B2 | 5/2008 | Rozenblitz et al. | |
| 7,376,212 B2 | 5/2008 | Dupuis | |
| 7,421,028 B2 | 9/2008 | Dupuis | |
| 7,425,787 B2 | 9/2008 | Larson, III | |
| 7,436,282 B2 | 10/2008 | Whittaker et al. | |
| 7,447,492 B2 | 11/2008 | Dupuis | |
| 7,460,604 B2 | 12/2008 | Dupuis | |
| 7,545,059 B2 | 6/2009 | Chen | |
| 7,577,223 B2 | 8/2009 | Alfano | |
| 7,650,130 B2 | 1/2010 | Dupuis | |
| 7,683,654 B2 | 3/2010 | Chen | |
| 7,692,444 B2 | 4/2010 | Chen | |
| 7,719,305 B2 | 5/2010 | Chen | |
| 7,737,871 B2 | 6/2010 | Leung et al. | |
| 7,738,568 B2 | 6/2010 | Alfano | |
| 7,741,943 B2 | 6/2010 | Fouquet | |
| 7,746,943 B2 | 6/2010 | Yamaura | |
| 7,821,428 B2 | 10/2010 | Leung | |
| 7,856,219 B2 | 12/2010 | Dupuis | |
| 7,920,010 B2 | 4/2011 | Chen | |
| 7,932,799 B2 * | 4/2011 | Loef et al. | 336/200 |
| 7,948,067 B2 | 5/2011 | Ho | |
| 8,049,573 B2 | 11/2011 | Alfano | |
| 8,061,017 B2 | 11/2011 | Fouquet | |
| 8,064,872 B2 | 11/2011 | Dupuis | |
| 8,093,983 B2 | 1/2012 | Fouquet | |
| 2002/0075116 A1 | 6/2002 | Peels et al. | |
| 2002/0110013 A1 * | 8/2002 | Park et al. | 363/153 |
| 2002/0135236 A1 | 9/2002 | Haigh | |
| 2003/0042571 A1 | 3/2003 | Chen et al. | |
| 2004/0056749 A1 | 3/2004 | Kahlmann et al. | |
| 2005/0003199 A1 | 1/2005 | Takaya et al. | |
| 2005/0057277 A1 | 3/2005 | Chen et al. | |
| 2005/0077993 A1 | 4/2005 | Kanno et al. | |
| 2005/0094302 A1 | 5/2005 | Matsuzaki et al. | |
| 2005/0128038 A1 | 6/2005 | Hyvonen | |
| 2005/0133249 A1 | 6/2005 | Fujii | |
| 2005/0269657 A1 | 12/2005 | Dupuis | |
| 2005/0272378 A1 | 12/2005 | Dupuis | |
| 2006/0028313 A1 | 2/2006 | Strzalkowski et al. | |
| 2006/0095639 A1 | 5/2006 | Guenin et al. | |
| 2006/0152322 A1 | 7/2006 | Whittaker et al. | |
| 2006/0170527 A1 | 8/2006 | Braunisch | |
| 2006/0176137 A1 | 8/2006 | Sato et al. | |
| 2006/0214759 A1 | 9/2006 | Kawaraj | |
| 2006/0220775 A1 | 10/2006 | Ishikawa | |
| 2007/0080587 A1 | 4/2007 | Ruizenaar et al. | |
| 2007/0085447 A1 | 4/2007 | Larson, III | |
| 2007/0085632 A1 | 4/2007 | Larson, III et al. | |
| 2007/0086274 A1 | 4/2007 | Nishimura et al. | |
| 2007/0133933 A1 | 7/2007 | Han | |
| 2007/0281394 A1 | 12/2007 | Kawabe et al. | |
| 2007/0290784 A1 | 12/2007 | Nesse et al. | |
| 2008/0007382 A1 | 1/2008 | Snyder | |
| 2008/0031286 A1 | 2/2008 | Alfano et al. | |
| 2008/0051158 A1 | 2/2008 | Male et al. | |
| 2008/0061631 A1 | 3/2008 | Fouquet et al. | |
| 2008/0174396 A1 | 7/2008 | Choi et al. | |
| 2008/0176362 A1 | 7/2008 | Sengupta et al. | |
| 2008/0179963 A1 | 7/2008 | Fouquet et al. | |
| 2008/0180206 A1 | 7/2008 | Fouquet | |
| 2008/0198904 A1 | 8/2008 | Chang | |
| 2008/0278275 A1 | 11/2008 | Fouquet | |
| 2008/0284552 A1 | 11/2008 | Lim et al. | |
| 2008/0308817 A1 | 12/2008 | Wang et al. | |
| 2008/0311862 A1 | 12/2008 | Spina | |
| 2009/0072819 A1 | 3/2009 | Takahashi | |
| 2009/0180403 A1 | 7/2009 | Tudosoiu | |
| 2009/0243782 A1 | 10/2009 | Fouquet et al. | |
| 2009/0243783 A1 | 10/2009 | Fouquet et al. | |
| 2009/0268486 A1 * | 10/2009 | Ljusev et al. | 363/15 |
| 2010/0020448 A1 | 1/2010 | Ng et al. | |
| 2010/0052120 A1 | 3/2010 | Pruitt | |
| 2010/0176660 A1 | 7/2010 | Fouquet | |
| 2010/0188182 A1 | 7/2010 | Fouquet et al. | |
| 2010/0259909 A1 | 10/2010 | Ho et al. | |
| 2010/0328902 A1 | 12/2010 | Ho et al. | |
| 2011/0075449 A1 | 3/2011 | Fouquet | |
| 2011/0095620 A1 | 4/2011 | Fouquet | |

FOREIGN PATENT DOCUMENTS

| | | | |
|---|---|---|---|
| CN | 1237081 | | 12/1999 |
| DE | 19911133 | | 10/2000 |
| DE | 10154906 | | 5/2003 |
| EP | 1309033 | | 5/2003 |
| EP | 1617337 | | 1/2006 |
| GB | 2403072 | | 6/2004 |
| JP | 57-39598 | | 3/1982 |
| JP | 61-59714 | | 3/1986 |
| JP | 3171705 | | 7/1991 |
| JP | 06-53052 | | 2/1994 |
| JP | 2000-508116 | | 6/2000 |
| JP | 2003-151829 | | 5/2003 |
| JP | 2005-513824 | | 5/2005 |
| WO | WO-9734349 | | 3/1997 |
| WO | WO-2005/001928 | | 6/2005 |
| WO | WO 2006/033071 | * | 3/2006 |
| WO | WO-2007/053379 | | 5/2007 |

OTHER PUBLICATIONS

U.S. Appl. No. 11/512,034, filed Aug. 28, 2006, Fouquet et al.
U.S. Appl. No. 11/747,092, filed May 10, 2007, Fouquet et al.
"Texas Instruments Dual Digital Isolators", *SLLS755E*Jul. 2007.
Allflex Flexible Printed Circuit, "Design Guide", <http://www.allflexinc.com> Retrieved Feb. 12, 2009.
Analog Devices, "iCoupler R Digital Isolation Products", 2005.
Analog Devices, Inc., "iCoupler Digital Isolator ADuM1100 Data Sheet,", *Rev F* 2006.
Avago Technologies, "ACCL-9xxx 3.3V/5V High Speed CMOS Capacitive Isolator", *Preliminary Datasheet*. 2005.
Chen, Baoxing et al., "High Speed Digital Isolators Using Microscale On-Chip Transformers", Jul. 22, 2003.
Chen, Baoxing, "iCoupler Products with iso Power Technology", "*Signal and Power Transfer Across Isolation Barrier Using Microtransformers*" Analog Devices 2006.
Electronic Design, "Planar Transformers make Maximum Use of Precious Board Space", *Penton Media, Inc., ED Online ID #7647* Mar. 9, 1998.
Fiercewireless, "Skyworks Introduces Industry's First Multi-band, Multi-mode TDD/TDD Power Amplifier for 4G LTE Applications Next-Generation TEC", Dec. 18, 2008, 6 pages.
Kliger, R., "Integrated Transformer-Coupled Isolation", Mar. 2003.
Krupka, J. et al., "Measurements of Permittivity, Loss Dielectric Tangent, and Resistivity of Float-Zone Silicon at Microwave Frequencies", *IEEE Abstract Microwave Theory and Techniques*, IEEE Transaction on vol. 54, Issue 11 Nov. 2006, 3995-4001.
Myers, John et al., "GMR Isolators", *Nonvalatile Electronics, Inc.* 1998.
Oljaca, Miroslav, "Interfacing the ADS1202 Modulator with a Pulse Transformer in Galvanically Isolated Systems", *SBAA096* Jun. 2003, 22 pages.
Payton Group International, , "Off the Shelf SMT Planar Transformers", <http://www.paytongroup.com> Retrieved Mar. 31, 2008.
Rogers Corporation, , "Advanced Circuit Materials, High Frequency Laminates and Flexible Circuit Materials", <http://www.rogerscorporation.com/mwu/translations/prod.htm> Mar. 2008.
Smith, Carl H. et al., "Chip-Size Magnetic Sensor Arrays", May 21, 2002.
Yang, Ru-Yuan, "Loss Characteristics of Silicon Substrate with Different Resistivities", *Microwave and Optical Technology Letters*, vol. 48, No. 9 Sep. 2006.
"Texas Instruments Dual Digital Isolators", *SLLS755E* Jul. 27.
Biersach, , "Designing Medical Electrical Equipment to Meet Safety Certification and Regulatory Requirements", *Underwriters Laboratories*, 6 pages, Table 2 Jan. 2002.
Doane, et al., "Multichip Module Technologies and Alternatives—The Basics", Section 5.3.2. 1993, 185.

* cited by examiner

COMPACT POWER TRANSFORMER COMPONENTS, DEVICES, SYSTEMS AND METHODS

RELATED APPLICATIONS

This application claims priority and other benefits from, and is a continuation-in-part of, each of the following patent applications: (a) U.S. patent application Ser. No. 12/059,747 filed Mar. 31, 2008 entitled "Coil Transducer with Reduced Arcing and Improved High Voltage Breakdown Performance Characteristics" to Fouquet et al. (hereafter "the '747 patent application"); (b) U.S. patent application Ser. No. 12/059,979 filed Mar. 31, 2008 entitled "Galvanic Isolators and Coil Transducers" to Fouquet et al. (hereafter "the '979 patent application"); (c) U.S. patent application Ser. No. 12/370,208 filed Feb. 12, 2009 entitled "High Voltage Hold-off Coil Transducer" to Fouquet et al. (hereafter "the '208 patent application"); (d) U.S. patent application Ser. No. 12/393,596 filed Feb. 26, 2009 entitled "Minimizing Electromagnetic Interference in Coil Transducers" to Fouquet et al. (hereafter "the '596 patent application"); (e) U.S. patent application Ser. No. 12/477,078 filed Jun. 2, 2009 entitled "Galvanic Isolator" to Gek Yong Ng. et al. (hereafter "the '078 patent application"); (f) U.S. patent application Ser. No. 12/495,733 filed Jun. 30, 2009 entitled "Coil Transducer Isolator Packages" to Fouquet et al. (hereafter "the '733 patent application"); (g) U.S. patent application Ser. No. 12/752,019 filed Mar. 31, 2010 entitled "Widebody Coil Isolators" to Ho et al. (hereafter "the '019 patent application"), and (h) U.S. patent application Ser. No. 12/751,971 filed Mar. 31, 2010 entitled "Narrowbody Coil Isolators" to Fouquet et al. (hereafter "the '971 patent application").

This application also hereby incorporates by reference herein, each in its respective entirety, the foregoing '747, '979, '208, '596, '078, '733, '019 and '971 patent applications.

FIELD OF THE INVENTION

Various embodiments of the invention described herein relate to the field of compact power transformers, and components, devices, systems and methods associated therewith.

BACKGROUND

Compact high voltage isolation power sources known in the prior art include conventional isolated power supplies, batteries, and silicon-based isolated power devices such as those made by Analog Devices, Inc.™ ("ADI"). Conventional compact isolated power supplies are often quite large and typically are designed to provide more power than many applications where high power efficiency is required. Batteries tend to be large, must be replaced periodically, and eventually wind up in landfills. Silicon-based isolated power devices typically make inefficient use of power, may have difficulty holding off high voltages, and can exhibit problems with respect to electromagnetic compatibility (EMC) and electromagnetic interference (EMI).

What is needed is a compact high voltage isolation power transformer that is small, transfers power with increased efficiency, has improved high voltage breakdown capabilities, may be built at lower cost, or that has other advantages or characteristics that will become apparent after having read and understood the specification and drawings hereof.

SUMMARY

In one embodiment, there is provided a compact power transformer comprising an electrically insulating substrate comprising opposing upper and lower surfaces and an electrically insulating, non-metallic, non-semiconductor low dielectric loss material, a power amplifier circuit configured to receive an input DC voltage and convert the DC voltage into an AC power signal, a first transmitting coil disposed upon, in or near the upper surface, an input impedance matching circuit having a first input operably connected to the power amplifier circuit, and a first output operably connected to the first coil, a second receiving coil disposed upon, in or near the lower surface, and an output impedance matching circuit having a second input operably connected to the second coil, and a second output, wherein the first coil is separated from the second coil by at least portions of the substrate, the first and second coils are spatially arranged and configured respecting one another such that the AC power signals may be transmitted by the first coil to the second coil across a dielectric barrier comprising the non-semiconductor low dielectric loss material disposed therebetween including at least portions of the substrate, the input impedance matching circuit is configured to match a first impedance of the first coil to an impedance of the power amplifier circuit, and the output impedance matching circuit is configured to match an impedance of the second coil to a second impedance of an output circuit operably connected to the second output.

In another embodiment, there is provided a power transformer comprising first and second electrically insulating substrates comprising an electrically insulating, non-metallic, non-semiconductor low dielectric loss material, a power amplifier circuit configured to receive an input DC voltage and convert the DC voltage signal into an AC power signal, a first transmitting coil, an input impedance matching circuit having a first input operably connected to the power amplifier circuit, and a first output operably connected to the first coil, second and third receiving coils disposed above and below the first coil, at least portions of the first substrate being disposed between the first coil and the second coil, at least portions of the second substrate being disposed between the first coil and the third coil, and an output impedance matching circuit having second inputs operably connected to the second and third coils, and further comprising a second output, wherein the first coil is separated from the second and third coils by at least portions of the first and second substrates, respectively, the first, second and third coils are spatially arranged and configured respecting one another such that the AC power signals may be transmitted by the first coil to the second and third coils across first and second dielectric barriers comprising the non-semiconductor low dielectric loss material disposed therebetween including at least portions of the first and second substrates, respectively, the input impedance matching circuit is configured to match a first impedance of the first coil to an impedance of the power amplifier circuit, and the output impedance matching circuit is configured to match an impedance of the second and third coils to a second impedance of an output circuit operably connected to the second output.

Further embodiments are disclosed herein or will become apparent to those skilled in the art after having read and understood the specification and drawings hereof.

BRIEF DESCRIPTION OF THE DRAWINGS

Different aspects of the various embodiments will become apparent from the following specification, drawings and claims in which:

The drawings are not necessarily to scale. Like numbers refer to like parts or steps throughout the drawings, unless otherwise noted.

DETAILED DESCRIPTIONS OF SOME EMBODIMENTS

Figure 1:
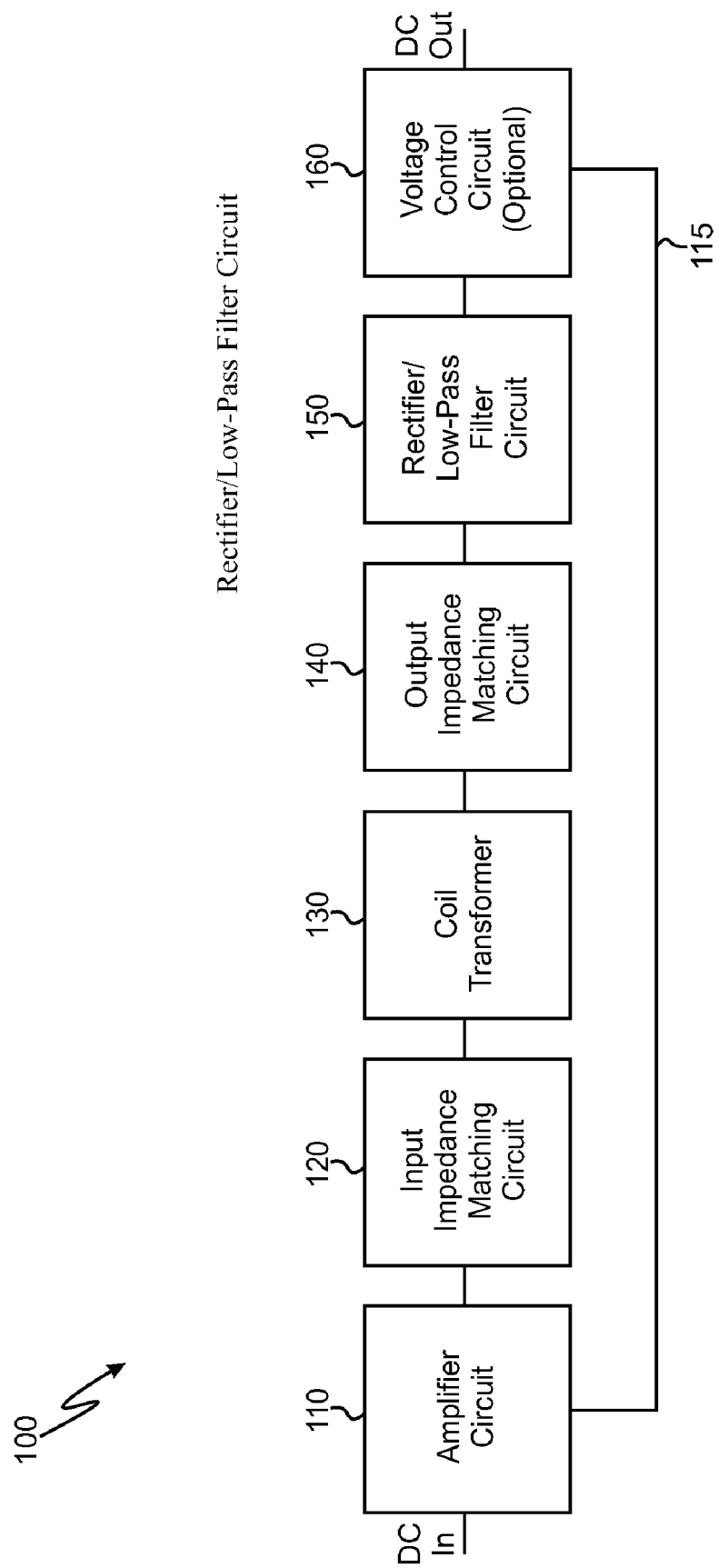
FIG. 1 shows one embodiment of a block diagram of a compact power transformer 100.

In the following description, specific details are provided to impart a thorough understanding of the various embodiments of the invention. Upon having read and understood the specification, claims and drawings hereof, however, those skilled in the art will understand that some embodiments of the invention may be practiced without hewing to some of the specific details set forth herein. Moreover, to avoid obscuring the invention, some well known circuits, materials and methods finding application in the invention are not disclosed in detail herein.

In the drawings, some, but not all, possible embodiments of the invention are illustrated, and further may not be shown to scale.

The term "horizontal" as used herein is defined as a plane substantially parallel to the conventional plane or surface of the substrate of the invention, regardless of its actual orientation in space. The term "vertical refers to a direction substantially perpendicular to the horizontal as defined above. Terms such as "on,", "above," "below," "bottom," "top," "side," "sidewall," "higher," "lower," "upper," "over" and "under" are defined in respect of the horizontal plane discussed above.

Referring first to FIG. 1, there is shown one embodiment of a block diagram of a compact power transformer 100 comprising input amplifier circuit 110, input impedance matching circuit 120, coil transformer 130, output impedance matching circuit 140, rectifier/low-pass filtering circuit 150, and optional voltage control circuit 160. In a one embodiment, input amplifier 110 is a Class E amplifier of a type for power transformer applications known to those skilled in the art. Input impedance matching circuit 120 is configured to match the impedance of amplifier circuit 110 to that of the input coil of coil transformer 130. In one embodiment, coil transformer 130 has two coils, where an input coil transfers power across a dielectric barrier to an output coil. In another embodiment, and as discussed in further detail below, coil transformer 130 has three coils, where an input coil is sandwiched between upper and lower output coils and transfers power across two different dielectric barriers to the two different corresponding output coils. Output impedance matching circuit 140 is configured to match the impedance of rectifier/low-pass filter circuit 150 to that of the output coil of coil transformer 130. Voltage control circuit 160 is optional, and is configured to provide a feedback signal to control the duty cycle of a switch in amplifier circuit 110, thereby altering the DC output voltage and power.

Figure 2:
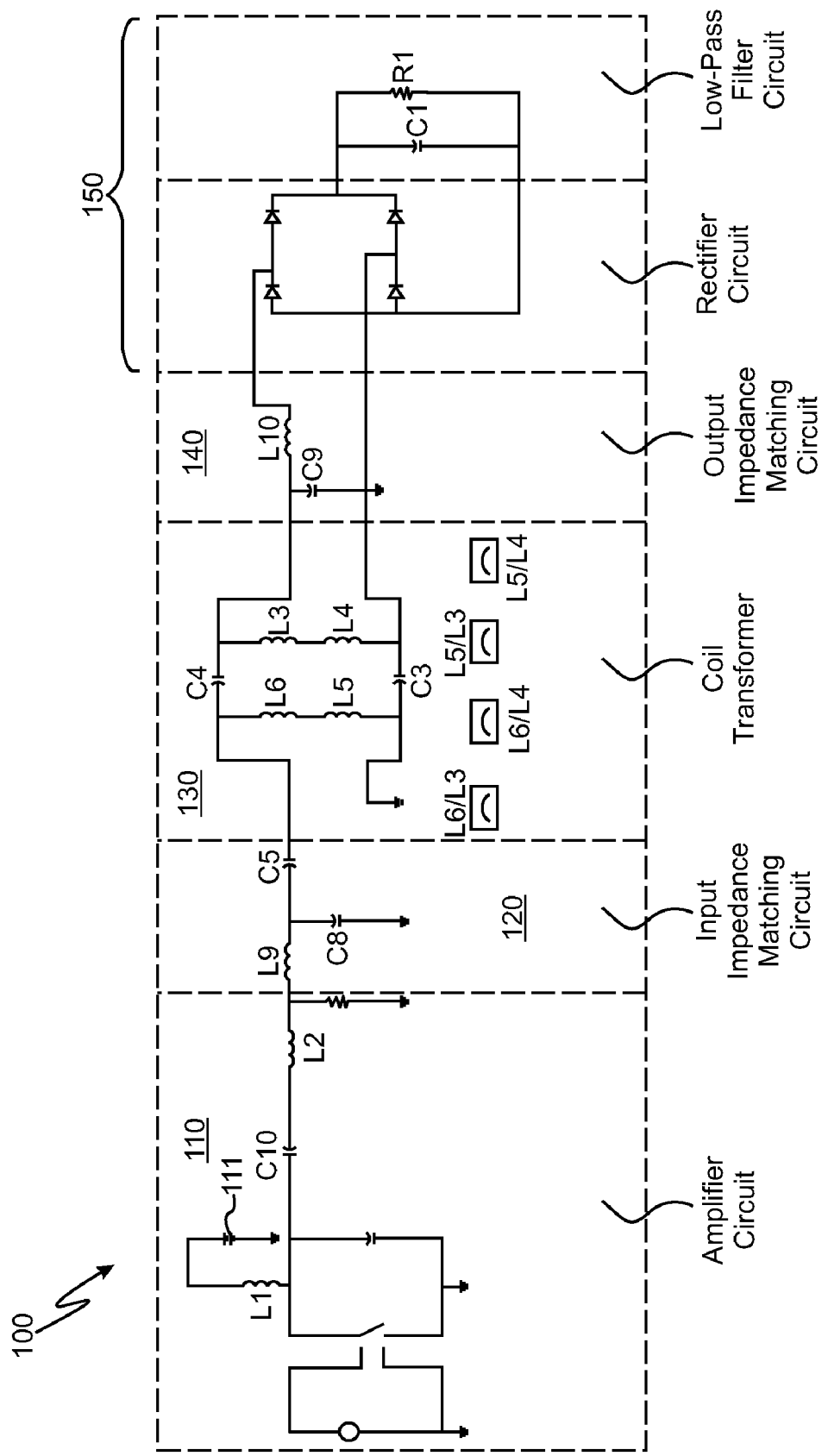
FIG. 2 shows one embodiment of individual circuits corresponding to compact power transformer 100 of FIG. 1.

Referring now to FIG. 2, there is shown one embodiment of individual circuits corresponding to power transformer 100, including input amplifier circuit 110, input impedance matching circuit 120, coil transformer 130, output impedance matching circuit 140, and rectifier/low-pass filtering circuit 150. As shown in FIG. 2, input amplifier circuit 110 comprises a relatively high-speed switch (e.g., 300 MHz or higher) that generates an AC signal from an input DC voltage in a manner well known to those skilled in the art, such as, by way of example, in accordance with the manner in which many Class E amplifiers operate. The configurations and parameters of the inductor and capacitors of input impedance matching circuit 120 are selected to match the impedance of amplifier circuit 110 to that of the first coil of coil transformer 130 (see L6 and L5 in circuit 130). The configurations and parameters of the inductor and capacitor of output impedance matching circuit 140 are selected to match the impedance of rectifier and low-pass filter circuits 150 to that of the second coil of coil transformer 130 (see L3 and L4 in circuit 130). The mutual inductances arising between the pairs of coils in coil transformer circuit 130 are represented by the symbols labelled L6/L3; L6/L4; L5/L3 and L5/L4 at the bottom of coil transformer circuit 130, where each input inductor is coupled to each output inductor to yield a total of the four shown mutual inductances.

In FIG. 2, amplifier circuit 110 includes power supply 111 that may be sized large enough to provide power for circuitry on both sides of the isolation gap of coil transformer 130. According to one embodiment, amplifier circuit 110 is an inverter circuit configured to generate an AC or oscillatory power signal from the DC voltage provided by the power supply. In a further embodiment, the generated AC power signal has a frequency ranging between 9 MHz and 1.1 GHz. The AC or oscillatory power signal is transferred to the receiver side of the isolation gap by coil transformer 130. The output of the secondary winding of coil transformer 130 is rectified by rectifier/low-pass filter circuit 150 to provide an isolated power supply output. One advantage of various embodiments is that power may be safely and conveniently provided across substrate 33 and/or coil transformer 130, and thus such embodiments are well-adapted for medical applications and other applications where electrically isolated power may be difficult or costly to provide. Power transformer 100 can provide a voltage step up or step down to facilitate the generation of the different output voltages. Alternatively, power may also be derived from a train of pulses applied to power transformer 100 from an external power source. Note that in some embodiments, multiple output impedance matching circuits may be desirable or required, and further that output impedance matching circuits different from those disclosed explicitly herein may be provided that are well known to those skilled in the art, such as T-network or π-network impedance matching circuits.

Note still further that in some embodiments, circuits 110 and 120 are incorporated into a first integrated CMOS or BiCMOS integrated circuit, and that circuits 140, 150 and 160 are incorporated into a second integrated CMOS or BiCMOS integrated circuit.

Figure 3:
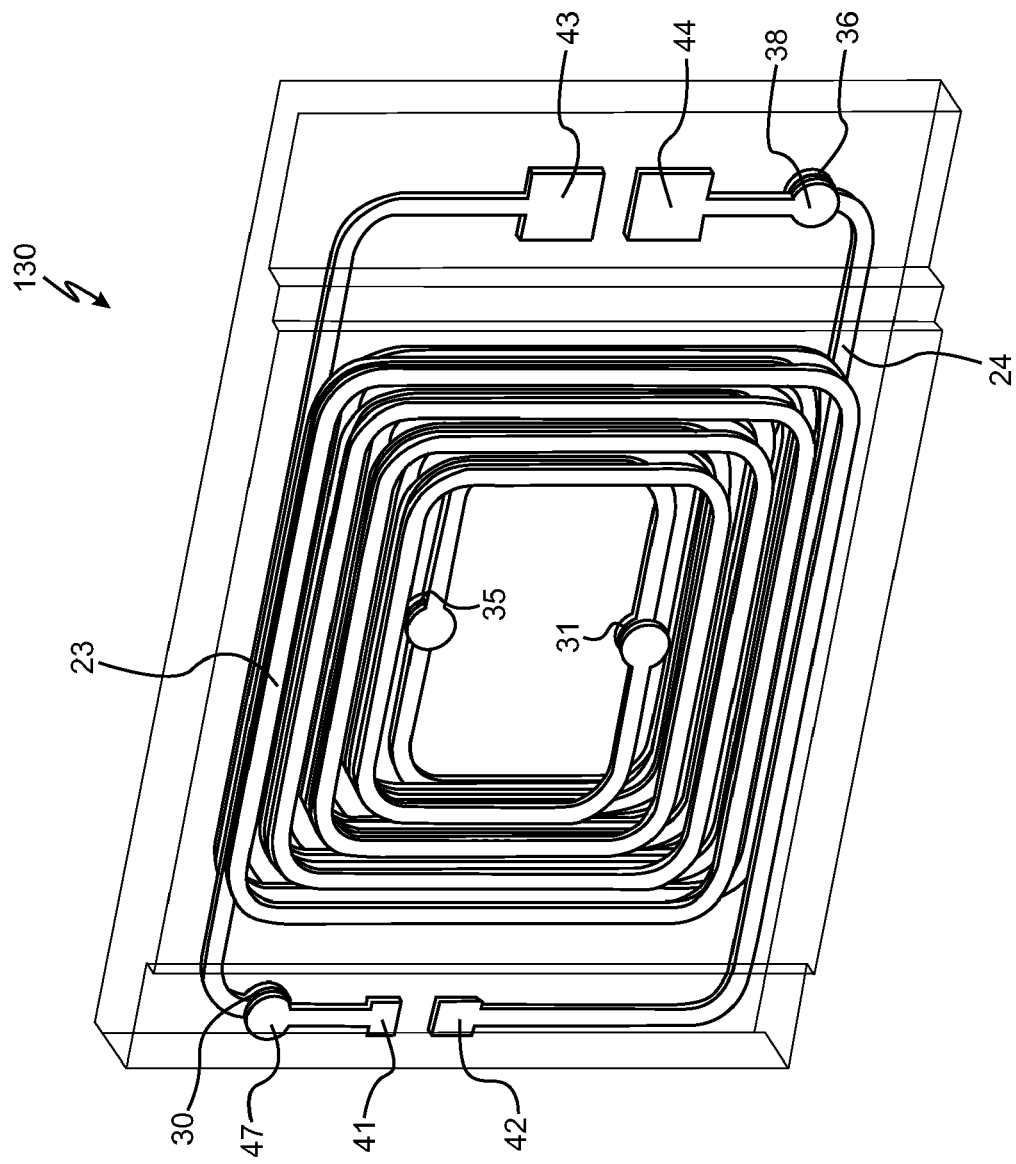
FIG. 3 shows a top perspective view of one embodiment of a two-coil compact power transformer 130.
Figure 4:
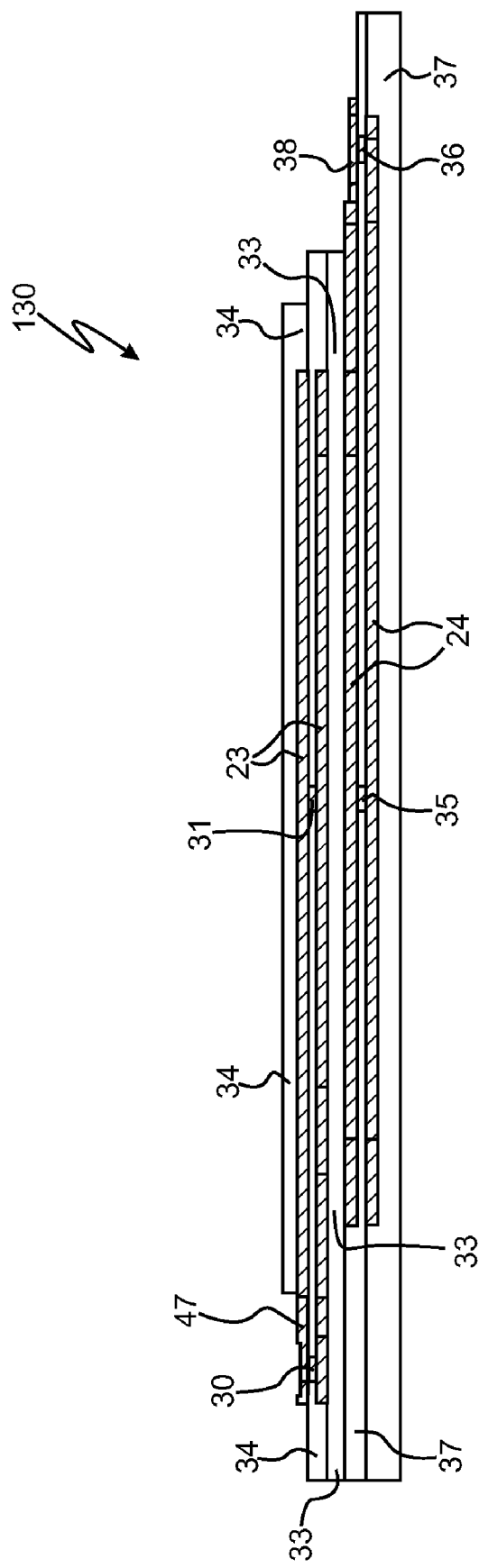
FIG. 4 shows a side cross-sectional view of the two-coil compact power transformer 130 of FIG. 3.

FIG. 3 shows a top plan view of one embodiment of two-coil transformer 130, and FIG. 4 shows a side cross-sectional view of two-coil transformer 130 of FIG. 3. In combination with substrate 33 and other components of coil transformer 130, coils 23 and 24 form a high voltage isolation power transfer transformer device. As shown in FIGS. 3 and 4, coil 23 is separated from coil 24 by at least portions of substrate 33, and coil 23 and coil 24 are spatially arranged and configured respecting one another such that AC power signals may be transmitted by coil 23 to coil 24 across a gap or dielectric barrier comprising electrically insulating, non-metallic, non-semiconductor, low dielectric loss material disposed therebetween, and from which at least portions of substrate 33 are formed. In one embodiment, such a dielectric barrier includes substrate 33, and electrically insulating layers 34 and 37 are disposed atop and below substrate 33. Amplifier circuit 110 and input impedance matching circuit 120 are operably connected to first coil 23 and output impedance matching circuit 140 and rectifier/low-pass filter circuit 150 are operably connected to second coil 24.

Continuing to refer to FIGS. 1 through 4, it will be seen that according to one embodiment power transformer 100 comprises electrically insulating substrate 33 comprising opposing upper and lower surfaces and an electrically insulating, non-metallic, non-semiconductor low dielectric loss material. Power amplifier circuit 110 is configured to receive an input DC voltage and convert the DC voltage into an AC power signal. First transmitting coil 23 is disposed upon, in or near the upper surface of substrate 33. Input impedance matching circuit 120 has a first input operably connected to power amplifier circuit 110, and a first output operably connected to first coil 23. Second receiving coil 24 is disposed upon, in or near the lower surface of substrate 33. Output impedance matching circuit 140 has a second input operably connected to second coil 24, and a second output. First coil 23 is separated from second coil 24 by at least portions of substrate 33. First and second coils 23 and 24 are spatially arranged and configured respecting one another such that the AC power signals may be transmitted by first coil 23 to second coil 24 across a dielectric barrier comprising the non-semiconductor low dielectric loss material and at least portions of substrate 33 disposed therebetween. Input impedance matching circuit 120 is configured to match a first impedance of first coil 23 to an impedance of power amplifier circuit 110. The output impedance matching circuit is configured to match an impedance of second coil 24 to a second impedance of an output circuit operably connected to the second output.

Substrate 33, and layers 34 and 37, may comprise any of a number of different non-metallic, non-semiconductor, low dielectric loss materials, more about which is said below. In one embodiment, substrate 33, and layers 34 and 37, are capable of withstanding several kilovolts of potential difference between the input and output sides of coil transformer 130, and thus exhibit high voltage breakdown performance characteristics.

Amplifier circuit 110 changes an incoming DC voltage into an AC power signal having a waveform suitable for driving first coil 23, after passing through input impedance matching circuit 120. Output impedance matching circuit 140 and rectifier/low-pass filter circuit 150 are configured to change the AC power signal exiting second coil 24 back into a DC voltage that looks like the incoming DC voltage. Circuits 110, 120, 130, 140, 150 and 160 (see FIG. 1) are preferably packaged in a format compatible with standard electronics assembly processes, such as using lead frame or printed circuit board assembly techniques. In some embodiments, packaging comprises mounting the various components of power transformer 100 on a lead frame, wirebonding the components together, and surrounding them with a molding material to hold everything together after sacrificial metal leads have been separated from the lead frame and formed into standard integrated circuit leads. In magnetic transformers, design of the lead frame is important to avoid degrading the performance of coil transformer 130.

As further shown in FIGS. 3 and 4, coil transformer 130 comprises coils 23 and 24 disposed on opposing top and bottom sides of substrate 33. In another embodiment, coils 23 and 24 are disposed on a same side of substrate 33, and another insulating layer may be disposed between coils 23 and 24. Other configurations of coils 23 and 24 respecting one another are also contemplated.

Note that circuits 120 and 140 in FIGS. 1 and 2 may be connected to bond pads 41 and 42, and 43 and 44 of coil transformer 130, as shown in FIG. 3. Alternatively, such circuits may be attached to a lead frame and connected by wire bonds to bond pads attached to coils 23 and 24. Other packaging embodiments are also contemplated. In one embodiment, coils 23 and 24 are fabricated by lithographically patterning metal layers on the surface of substrate 33, although many other means of forming coils 23 and 24 are contemplated, such as placing such coils on different layers or substrates and then laminating the substrates or layers together. Alternatively, an electrically insulating, non-metallic, non-semiconductor, low dielectric loss layer or substrate may be disposed below coils 23 and 24. Note that in some embodiments amplifier circuit 110 and input impedance matching circuit 120 on the one hand, and output impedance matching circuit 140, rectifier and low-pass filtering circuits 150 on the other hand (and optional voltage control circuit 160, if present), are integrated circuits or chips, as described above.

Substrate 33, and layers 34 and 37, are formed of an appropriate electrically insulating, non-metallic, non-semiconductor, low dielectric loss materials. In one embodiment, a suitable such material has a dielectric loss tangent at room temperature that is less than about 0.05, less than about 0.03, less than about 0.01, less than about 0.001 or less than about 0.0001. Even though the material employed to form substrate 33 and layers 34 and 37 is a non-semiconductor material, we define dielectric loss tangent values associated therewith herein to permit comparison of the novel substrate material of the invention to known semiconductor materials. Further information regarding dielectric loss tangents and the intrinsic and extrinsic losses associated therewith is set forth in "Loss Characteristics of Silicon Substrate with Different Resistivities" to Yang et al., pp. 1773-76, vol. 48, No. 9, September 2006, Microwave and Optical Technology Letters. Yang et al. discuss theoretically and experimentally dividing dielectric losses into an intrinsic loss tangent of silicon and an extrinsic loss associated with substrate leakage losses, and demonstrate that as doping levels in silicon increase, extrinsic losses also increase.

Some examples of suitable materials for forming substrate 33 and layers 34 and 37 also include, but are not limited to, one or more of printed circuit board material, FR4 and other printed circuit board materials, fiberglass, glass, ceramic, polyimide, polyimide film, a polymer, an organic material, a combination of an organic filler such as epoxy and an inorganic solid such as glass, beryllia, alumina, a flex circuit material, epoxy, epoxy resin, a printed circuit board material, plastic, DUPONT™ KAPTON™, DUPONT™ PYRALUX AB™ laminate, ESPANEX™ materials manufactured by the Nippon Steel and Chemical Company, Ltd., and a ROGERS™ material (e.g., PTFE—or polytetrafluoroethylene—and glass, PTFE and ceramic, PTFE, glass and ceramic, or thermoset plastic). The particular choice of the material from which substrate 33 and layers 34 and 37 are formed will, in general, depend on cost, the degree or amount of voltage breakdown protection, dielectric loss or thermal conductivity that is desired, the particular application at hand, and other factors or considerations. For example, flex circuit substrates are well suited for applications involving high voltages, and to reduce manufacturing and processing costs flex circuit substrates may be employed. For applications requiring high thermal conductivity, substrates comprising suitable ceramic materials may be employed.

In one embodiment, substrate 33, and layers 34 and 37, have sufficient thicknesses between the upper and lower horizontal surfaces thereof, and electrical insulation characteristics appropriate, to withstand the relatively high breakdown voltages for which coil transformer 130 is designed. By way of example, in one embodiment a breakdown voltage between coil 23 and coil 24 exceeds about 2,000 volts RMS when applied over a time period of about one minute. In other embodiments, the breakdown voltage between coil 23 and coil 24 exceeds about 2,000 volts RMS when applied over six minutes or over 24 hours. In other embodiments, even higher breakdown voltages can be withstood by substrate 33, layers 34 and 37, and coil transformer 130, such as about 2,500 volts RMS, about 3,000 volts RMS, about 4,000 volts RMS and about 5,000 volts RMS for periods of time of about 1 minute, 6 minutes and/or 24 hours.

In some embodiments, substrate 33, and layers 34 and 37, each have a thickness between the upper and lower horizontal surfaces thereof ranging between about 0.5 mils and about 10 mils, or between about 0.5 mils and about 25 mils. In one embodiment, the thickness of each of substrate 33 and layers 34 and 37 exceeds about 1.5 mils. In another embodiment, substrate 33 and layers 34 and 37 each comprises a plurality of layers, where at least one of the layers comprises a low dielectric loss material. As will be seen by referring to the Figures hereof, coil transformer 130 is thicker than substrate 33. For example, in one embodiment, coil transformer 130 is about 14 mils thick, while substrate 33 disposed therewithin is about 2 mils thick.

Continuing to refer to FIGS. 1, 2, 3 and 4, each of coils 23 and 24 has two ends. Each of these ends is connected to an appropriate terminal on the input or output circuits associated therewith.

To facilitate the use of wire bonding techniques in the manufacture of coil transformer 130, the structures shown in FIGS. 3 and 4 may be simplified to form two different metal layers disposed on a single substrate 33. In such an embodiment, coil transformer 130 may be constructed from two metal layers that are deposited and patterned on opposing sides of substrate 33. For example, the top metal layer may be patterned to provide coil 23 and the various connection pads utilized by the input and output circuits. The bottom metal layer may be used to fabricate coil 24, which underlies coil 23 and forms the second coil of the transformer on a bottom surface of substrate 33. The bottom layer may also be patterned to provide traces that are used to connect coil 24 to wire bond pads disposed on a top surface of substrate 33 through vertical vias. Coil 23 may then be connected to an input circuit by wire bonds, and coil 24 may be connected to an output circuit by a trace patterned from the top metal layer and by a wire bond. In one embodiment, wire bond pads are electroplated. The various connection pads for connecting coil transformer 130 to external circuits that are to be isolated by coil transformer 130 may also be patterned from the top metal layer.

In one embodiment, the structures illustrated in FIGS. 3 and 4 may be fabricated using a conventional printed circuit board fabrication line. As a result, the cost of manufacturing coil transformer 130 may be much less than that of a coil transformer constructed from silicon on a semiconductor fabrication line. In addition, most silicon substrates are known electrical conductors or semi-conductors, and generally do not exhibit the low dielectric loss properties of the substrates and coil transducers of some embodiments described herein. Embodiments of coil transformer 130 based on flexible organic/inorganic or organic substrates are particularly attractive. Printed circuit boards or circuit carriers are known in the art, and hence need not be discussed in detail here. It is worth noting, however, that substrate 33 and coil transformer 130 that are formed from printed circuit board materials do provide an excellent low-cost alternative to silicon-based materials. Printed circuit board materials are less expensive, easier to handle, and more amenable to quick design or manufacturing changes than silicon-based materials. For purposes of the present discussion it is sufficient to note that printed circuit boards may be fabricated by depositing a thin metal layer, or attaching a thin metal layer, on a somewhat flexible organic/inorganic substrate formed of fiberglass impregnated with epoxy resin and then converting the layer into a plurality of individual conductors using conventional photolithographic techniques. Additional metal layers may be added atop the thin metal layer after an intervening electrically insulating layer or coating has been laid down on the thin metal layer.

Flex circuit technology may also be employed to form substrate 33 and/or coil transformer 130, where substrate 33 and/or coil transformer 130 are made of an organic material such as polyimide. Films and laminates of this type are available commercially from DUPONT™ and the Nippon Steel and Chemical Company, Ltd., and utilize substrate materials known as KAPTON™ and ESPANEX™ made from polyimide. In some cases, a plurality of polyimide layers may be laminated with an adhesive to form substrate 33 and/or coil transformer 130. This type of circuit carrier or printed circuit board is significantly less expensive than conventional silicon semiconductor material based approaches and can be employed to provide substrate 33 and/or coil transformer 130 having a high breakdown voltage and other desirable high voltage isolation characteristics. Thinner substrates 33 and/or coil transformer 130 may be preferred in applications where signal losses between primary and secondary coils 23 and 24 must be minimized. For example, in one embodiment of substrate 33 and/or coil transformer 130, a PYRALUX AP™ laminate manufactured by DUPONT™ is employed to form a 2 mil thick KAPTON™ substrate 33, with electrically conductive copper layers from which coil traces may be formed or etched.

Note that coils 23 and 24 may assume any of a number of different structural configurations and nevertheless fall within the scope of the invention. For example, coils 23 and 24 may assume the circular or oval spirally-wound shapes illustrated in FIGS. 3 and 4, or may assume myriad other shapes such as rectangularly, squarely, triangularly, pentagonally, hexagonally, heptagonally or octagonally-wound shapes arranged in a horizontal plane, conductors arranged to interleave with one another within a horizontal plane, one or more serpentine conductors arranged in a horizontal plane, and so on. Any suitable structural configuration of coils 23 and 24 is permitted so long as the magnetic fields projected by one coil may be received and sufficiently well detected by the other opposing coil.

Substrate 33 is preferably fabricated to have a thickness between its upper and lower surfaces sufficient to prevent high voltage arcing. One advantage of the materials employed to form substrate 33 is that substrate 33 may be substantially thicker than is generally possible or financially feasible in commercial applications which employ conventional semiconductor materials and manufacturing processes. For example, substrate 33 may have a thicknesses ranging between about 1 mil and about 25 mils, between about 1.5 mils and about 25 mils, or between about 2 mils and about 25 mils. Polyimide processes compatible with silicon IC processes are typically much thinner and cannot withstand voltages nearly as high as those capable of being withstood by some embodiments of substrate 33. The high distance-through-insulation (DTI) and dielectric strength values characteristic of some embodiments of substrate 33 provide a desirable performance metric in many electrical isolator applications and easily meet most certification requirements issued by relevant standards organizations. Conversely, substrate 33 may also be made quite thin, e.g., 0.5 mils or less, and yet still provide relatively high voltage breakdown performance characteristics.

Note further that substrate 33 may be formed using any of a number of different manufacturing processes and electrically insulating, non-metallic, non-semiconductor, low dielectric loss materials described above. These processes and materials are amenable to processing electrically insulating materials in bulk and do not require the expensive and elaborate procedures required to handle semiconductor materials such as silicon. Moreover, substrate 33 provides superior high voltage breakdown performance characteristics respecting silicon-based devices owing to their increased distances-through-insulation, as described above. Because substrate 33 exhibits substantial distance-though-insulation and thickness, substrate 33 may be configured to impart substantial mechanical rigidity and strength to coil transformer 130. Unlike the relatively fragile and thin silicon substrates of the prior art, substrate 33 is mechanically robust and strong, and may be handled without special care.

Figure 5:
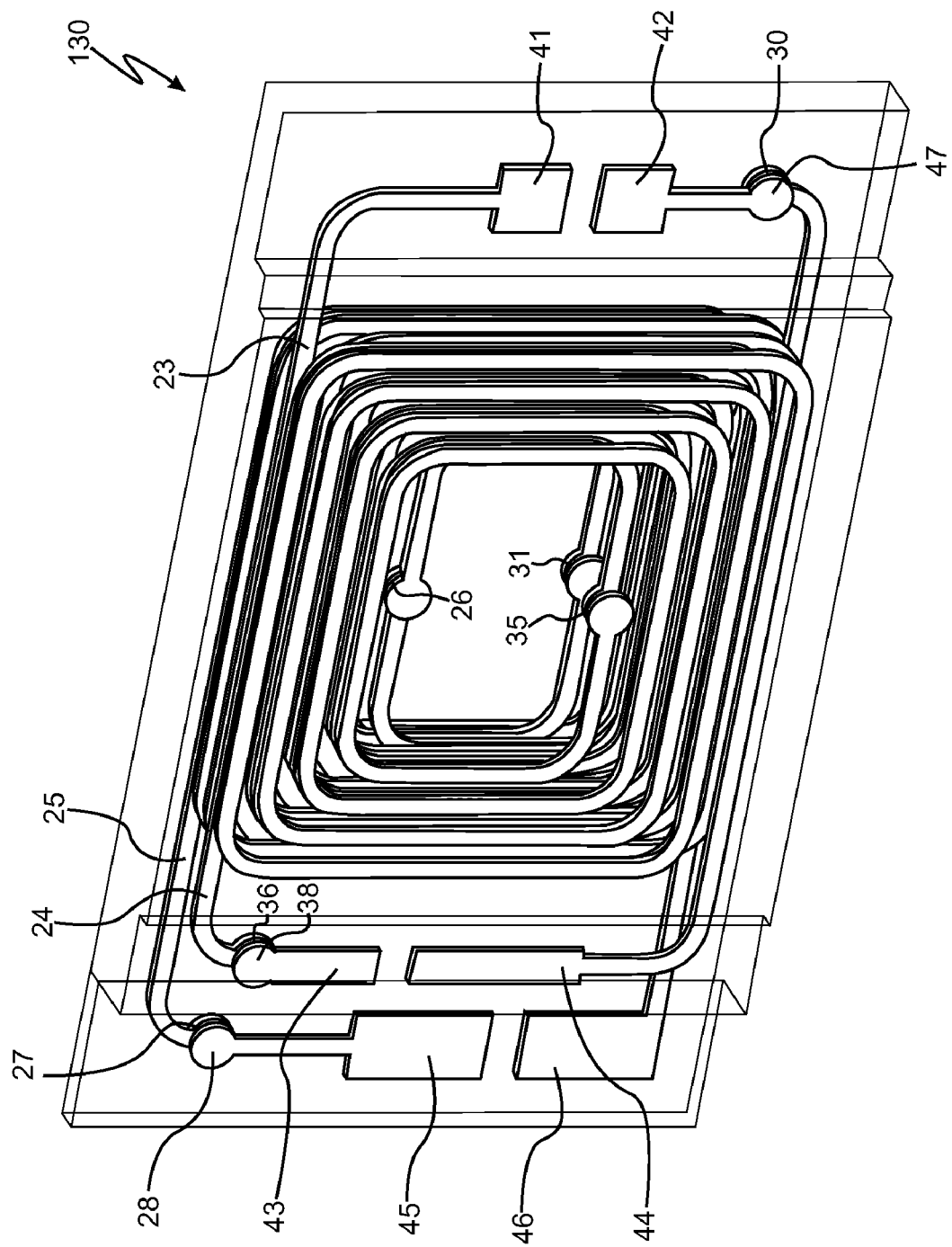
FIG. 5 shows a top perspective view of one embodiment of a three-coil compact power transformer 130.
Figure 6:
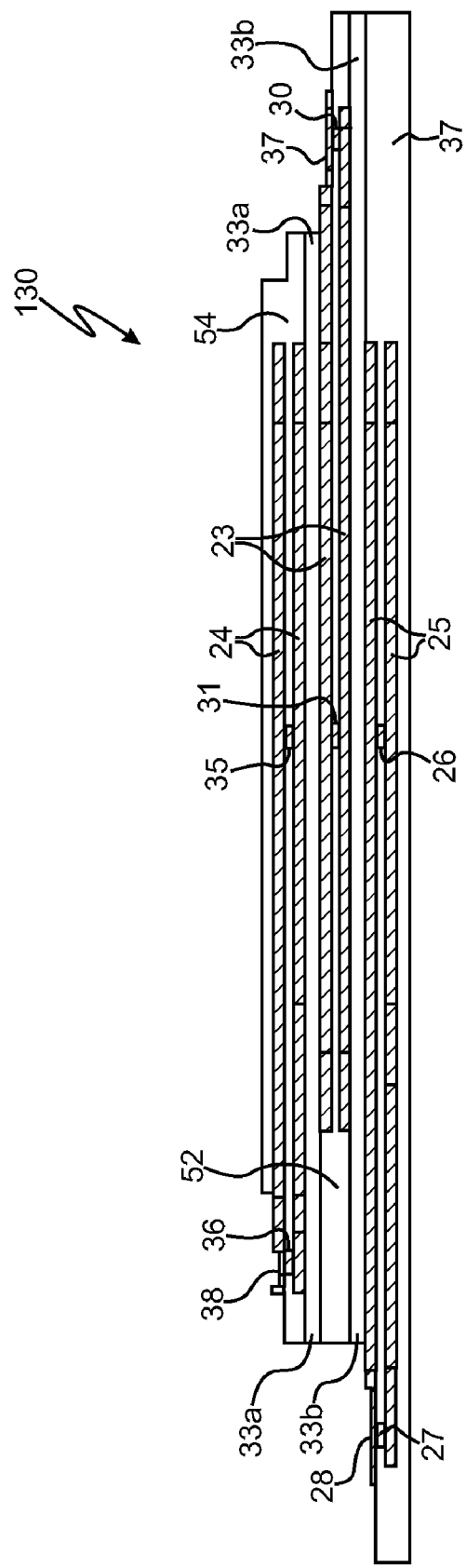
FIG. 6 shows a side cross-sectional view of the three-coil compact power transformer 130 of FIG. 5.

Referring now to FIGS. 5 and 6, there are shown a top perspective view of one embodiment of a three-coil power transfer transformer (FIG. 5), and a side cross-sectional view of the three-coil power transformer of FIG. 5 (FIG. 6). As shown, and with continued reference to FIGS. 1 and 2, power transformer 100 of FIGS. 5 and 6 comprises first and second electrically insulating substrates 33a and 33b, each of which comprises an electrically insulating, non-metallic, non-semiconductor low dielectric loss material. Power amplifier circuit 110 is configured to receive an input DC voltage and convert the DC voltage into an AC power signal. Input impedance matching circuit 120 has a first input operably connected to power amplifier circuit 110, and a first output operably connected to first coil 23. Second and third receiving coils 24 and 25 are disposed above and below first coil 23, where at least portions of first substrate 33a are disposed between first coil 23 and second coil 24. At least portions of second substrate 33b are disposed between first coil 23 and third coil 25. Output impedance matching circuit 140 has second inputs operably connected to the second and the third coils, and further comprises a second output. As further shown in FIGS. 5 and 6, first coil 23 is separated from second and third coils 24 and 25 by at least portions of the first and second substrates 33a and 33b, respectively. First, second and third coils 23, 24 and 25 are spatially arranged and configured respecting one another such that the AC power signals may be transmitted by first coil 23 to second and third coils 24 and 25 across first and second dielectric barriers comprising the non-semiconductor low dielectric loss material disposed therebetween (which includes at least portions of the first and second substrates, 33a and 33b, respectively). Input impedance matching circuit 120 is configured to match a first impedance of first coil 23 to an impedance of power amplifier circuit 110. Output impedance matching circuit 140 is configured to match an impedance of second and third coils 24 and 25 to a second impedance of an output circuit operably connected to the second output.

Substrates 33a, 33b, and layers 52, 54 and 37 shown in FIGS. 5 and 6 may comprise any of a number of different non-metallic, non-semiconductor, low dielectric loss materials, as described above, and in some embodiments are capable of withstanding several kilovolts of potential difference between the input and output sides of coil transformer 130, and thus exhibit high voltage breakdown performance characteristics.

As in the two-coil embodiment described above in connection with FIGS. 3 and 4, amplifier circuit 110 for coil transformer 130 shown in FIGS. 5 and 6 changes an incoming DC voltage into an AC power signal having a waveform suitable for driving first coil 23, after passing through input impedance matching circuit 120. Output impedance matching circuit 140 and rectifier/low-pass filter circuit 150 are configured to change the AC signals exiting the second and third coils 24 and 25 back into a DC voltage that looks like the incoming DC voltage. Circuits 110, 120, 130, 140, 150 and 160 (see FIG. 1) are preferably packaged in a format compatible with standard electronics assembly processes, such as lead frame or printed circuit board assembly techniques. In some embodiments, packaging comprises mounting the various components of power transformer 100 on a lead frame, wirebonding the components together, and surrounding them with a molding material to hold everything together after sacrificial metal leads have been separated from the lead frame and formed into standard integrated circuit leads. In magnetic transformers, design of the lead frame is important to avoid degrading the performance of coil transformer 100. Configurations of coils 23, 24 and 25 respecting one another other than those shown in FIGS. 5 and 6 are contemplated.

Note that circuits 120 and 140 in FIGS. 1 and 2 may be connected to bond pads 41 and 42, 43 and 44, and 45 and 46 of coil transformer 130, as shown in FIGS. 5 and 6. Alternatively, such circuits may be attached to a lead frame and connected by wire bonds to bond pads attached to coils 23, 24 and 25. Other packaging embodiments are also contemplated. In one embodiment, coils 23, 24 and 25 are fabricated by lithographically patterning metal layers on the surfaces of substrates 33a and 33b, although many other means of forming coils 23, 24 and 25 are contemplated. Note that in some embodiments amplifier circuit 110 and input impedance matching circuit 120 on the one hand, and output impedance matching circuit 140, rectifier and low-pass filter circuit 150 on the other hand (and optional voltage control circuit 160, if present), are integrated circuits or chips.

Substrates 33a and 33b, and layers 52, 54 and 37, are formed of an appropriate electrically insulating, non-metallic, non-semiconductor, low dielectric loss materials. In one embodiment, a suitable such material has a dielectric loss tangent at room temperature that is less than about 0.05, less than about 0.03, less than about 0.01, less than about 0.001 or less than about 0.0001. Even though the material employed to form substrates 33a and 33b and layers 52, 54 and 37 is a non-semiconductor material, we define dielectric loss tangent values associated therewith as set forth above.

Some examples of suitable materials for forming substrates 33a and 33b and layers 52, 54 and 37 also include, but are not limited to, one or more of printed circuit board material, FR4 and other printed circuit board materials, fiberglass, glass, ceramic, polyimide, polyimide film, a polymer, an organic material, a combination of an organic filler such as epoxy and an inorganic solid such as glass, beryllia, alumina, a flex circuit material, epoxy, epoxy resin, a printed circuit board material, plastic, DUPONT™ KAPTON™, DUPONT™ PYRALUX AB™ laminate, Nippon Steel and Chemical Company, Ltd. ESPANEX™ materials, and a ROGERS™ material (e.g., PTFE—or polytetrafluoroethylene—and glass, PTFE and ceramic, PTFE, glass and ceramic, or thermoset plastic). The particular choice of the material from which substrates 33a and 33b and layers 52, 54 and 37 are formed will, in general, depend on cost, the degree or amount of electrical isolation or voltage breakdown protection that is desired, the particular application at hand, and other factors or considerations. For example, glass and ceramic substrates are well suited for applications involving high voltages; to reduce manufacturing and processing costs, flex circuit substrates may be employed.

In one embodiment, substrates 33a and 33b, and layers 52, 54 and 37, have sufficient thicknesses between the upper and lower horizontal surfaces thereof, and electrical insulation characteristics appropriate, to withstand the relatively high breakdown voltages for which coil transformer 130 is designed. By way of example, in one embodiment a breakdown voltage between coil 23, and coils 24 and 25, exceeds about 2,000 volts RMS when applied over a time period of about one minute. In other embodiments, the breakdown voltage between coil 23, and coils 24 and 25, exceeds about 2,000 volts RMS when applied over six minutes or over 24 hours. In other embodiments, even higher breakdown voltages can be withstood by substrates 33a and 33b, and layers 52, 54, and 37, and coil transformer 130, such as about 2,500 volts RMS, about 3,000 volts RMS, about 4,000 volts RMS and about 5,000 volts RMS for periods of time of about 1 minute, 6 minutes and/or 24 hours.

In some embodiments, substrates 33a and 33b, and layers 52, 54 and 37, each have a thickness between the upper and lower horizontal surfaces thereof ranging between about 0.5 mils and about 10 mils, or between about 0.5 mils and about 25 mils. In one embodiment, the thickness of each of substrate 33 and layers 52, 54 and 37 exceeds about 1.5 mils. In another embodiment, substrates 33a and 33b, and layers 52, 54 and 37, each comprises a plurality of layers, where at least one of the layers comprises a low dielectric loss material. As will be seen by referring to the Figures hereof, coil transformer 130 is thicker than substrates 33a and 33b. For example, in one embodiment, coil transformer 130 is about 21 mils thick, while substrates 33a and 33b disposed therewithin are each about 2 mils thick.

Continuing to refer to FIGS. 1, 2, 5 and 6, each of coils 23, 24 and 25 has two ends. Each of these ends is connected to an appropriate terminal on the input or output circuits associated therewith.

In one embodiment, the structures illustrated in FIGS. 5 and 6 may be fabricated using a conventional printed circuit board fabrication line. As a result, the cost of manufacturing coil transformer 130 may be much less than that of a coil transformer constructed from silicon on a semiconductor fabrication line.

Flex circuit technology may also be employed to form substrates 33a and 33b, and coil transformer 130, where substrates 33a and 33b, and coil transformer 130, are made of an organic material such as polyimide. Films and laminates of this type are available commercially from DUPONT™ and Nippon Steel and Chemical Company, Ltd. and utilize substrate materials known as KAPTON™ or ESPANEX™ made from polyimide. In some cases, a plurality of polyimide layers may be laminated with an adhesive to form substrates 33a and 33b, and coil transformer 130. This type of circuit carrier or printed circuit board is significantly less expensive than conventional silicon semiconductor material based approaches and can be employed to provide substrates 33a and 33b, and coil transformer 130, having high breakdown voltage and other desirable high voltage isolation characteristics. Thinner substrates 33a and 33b, insulating layers 52, 54 and 37, and coil transformer 130, may be preferred in applications where power losses between primary and secondary coils 23, and 24 and 25, must be minimized. For example, in one embodiment of substrates 33a and 33b, and coil transformer 130, a PYRALUX AP™ laminate manufactured by DUPONT™ is employed to form 2 mil thick KAPTON™ substrates 33a and 33b, and electrically conductive copper layers from which coil traces may be formed or etched.

Note that coils 23, 24 and 25 may assume any of a number of different structural configurations and nevertheless fall within the scope of the invention. For example, coils 23, 24 and 25 may assume the circular or oval spirally-wound shapes illustrated in FIGS. 5 and 6, or may assume myriad other shapes such as rectangularly, squarely, triangularly, pentagonally, hexagonally, heptagonally or octagonally-wound shapes arranged in a horizontal plane, conductors arranged to interleave with one another within a horizontal plane, one or more serpentine conductors arranged in a horizontal plane, and so on. Any suitable structural configuration of coils 23, 24 and 25 is permitted so long as the magnetic fields projected by one coil may be received and sufficiently well detected by the other opposing coil.

Substrates 33a and 33b are preferably fabricated to have thicknesses between their respective upper and lower surfaces sufficient to prevent high voltage arcing. One advantage of the materials employed to form substrates 33a and 33b is that substrates 33a and 33b may be substantially thicker than is generally possible or financially feasible in commercial applications which employ conventional semiconductor materials and manufacturing processes, as described above. For example, substrates 33a and 33b may each have a thicknesses ranging between about 1 mil and about 25 mils, between about 1.5 mils and about 25 mils, or between about 2 mils and about 25 mils. Polyimide processes compatible with silicon IC processes are typically much thinner and cannot withstand voltages nearly as high as those capable of being withstood by some embodiments of substrates 33a and 33b. The high distance-through-insulation (DTI) and dielectric strength values characteristic of some embodiments of substrates 33a and 33b provide a desirable performance metric in many electrical isolator applications and easily meet most certification requirements issued by relevant standards organizations. Conversely, substrates 33a and 33b may also be made quite thin, e.g., 0.5 mils or less, and yet still provide relatively high voltage breakdown performance characteristics.

Note further that substrates 33a and 33b may be formed using any of a number of different manufacturing processes and electrically insulating, non-metallic, non-semiconductor, low dielectric loss materials described above. These processes and materials are amenable to processing electrically insulating materials in bulk and do not require the expensive and elaborate procedures required to handle semiconductor materials such as silicon. Moreover, substrates 33a and 33b provide superior high voltage breakdown performance characteristics respecting silicon-based devices owing to their increased distances-through-insulation, as described above. Because substrates 33a and 33b exhibit substantial distance-though-insulation and thickness, substrates 33a and 33b may be configured to impart substantial mechanical rigidity and strength to coil transformer 130. Unlike the relatively fragile and thin silicon substrates of the prior art, substrates 33a and 33b are mechanically robust and strong, and may be handled without special care.

Figure 7:
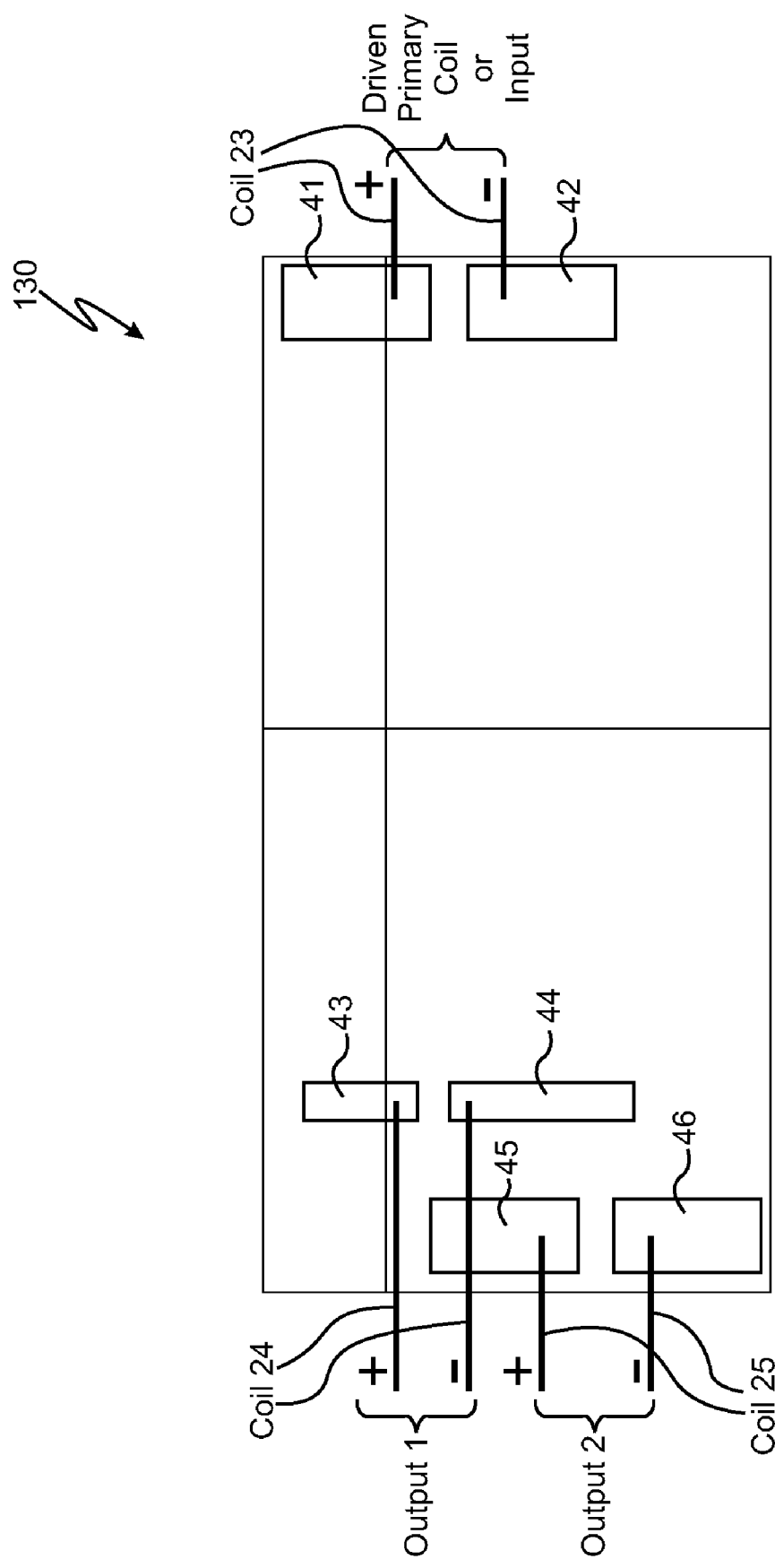
FIG. 7 shows one embodiment of separate outputs for a three-coil compact power transformer 130.

FIG. 7 shows one embodiment of separate outputs for a three-coil compact power transformer 130, where the two separate outputs are independent of one another and do not share a ground or a high side. Note that such an embodiment requires the use of dedicated separate output impedance matching circuits 140.

Figure 8:
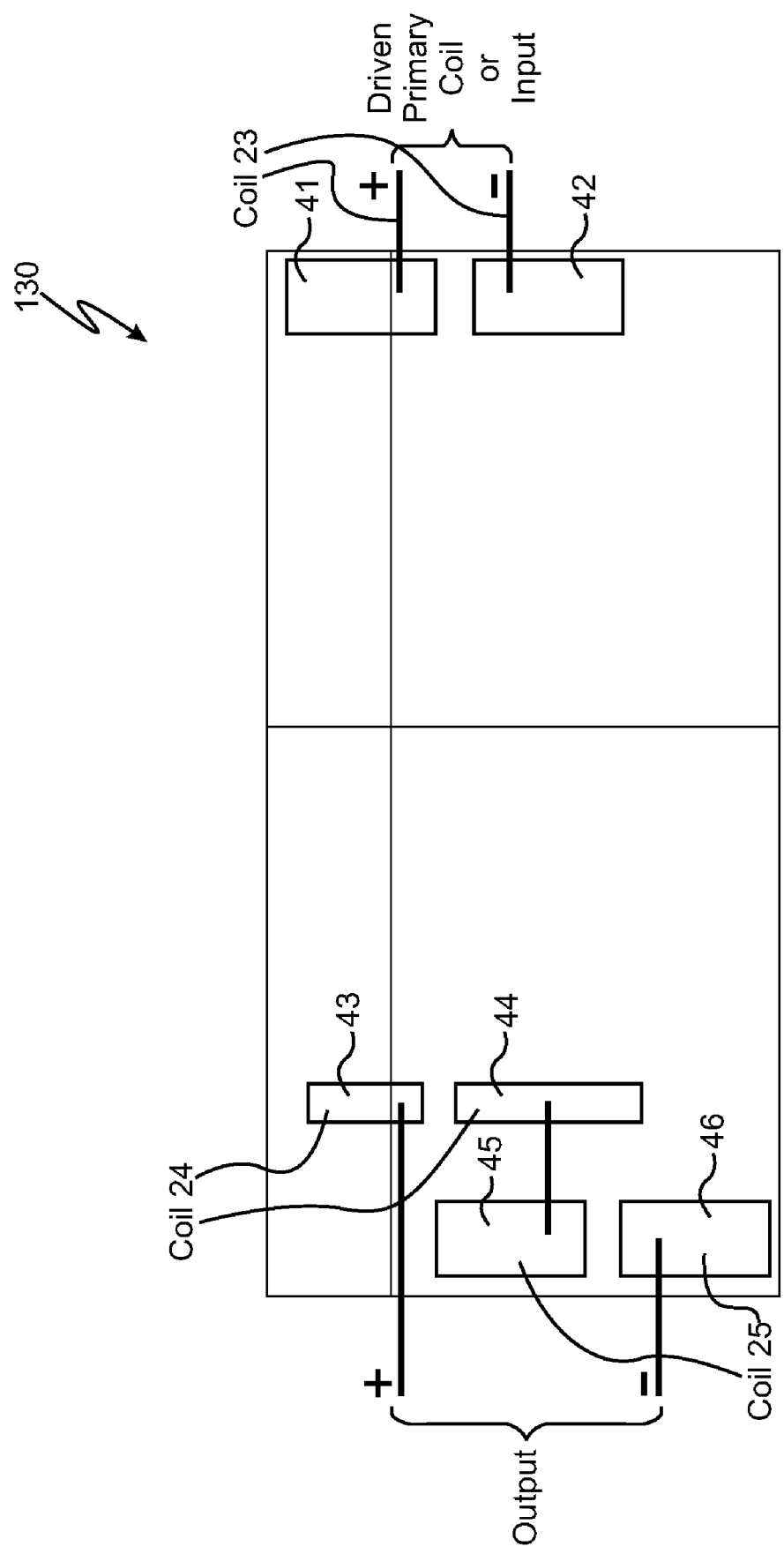
FIG. 8 shows another embodiment of outputs connected in series for a three-coil compact power transformer 130.

FIG. 8 shows yet another embodiment of outputs connected in series for a three-coil compact power transformer 130, where the low side of coil 24 is connected to the high side of coil 25. Note that such connections may also be established in reverse, where for example the low side of coil 25 is connected to the high side of coil 24. Doing so, however, may yield a less-than-optimal pad configuration, however. In the embodiment of FIG. 8, a single impedance matching circuit 140 may be employed.

Figure 9:
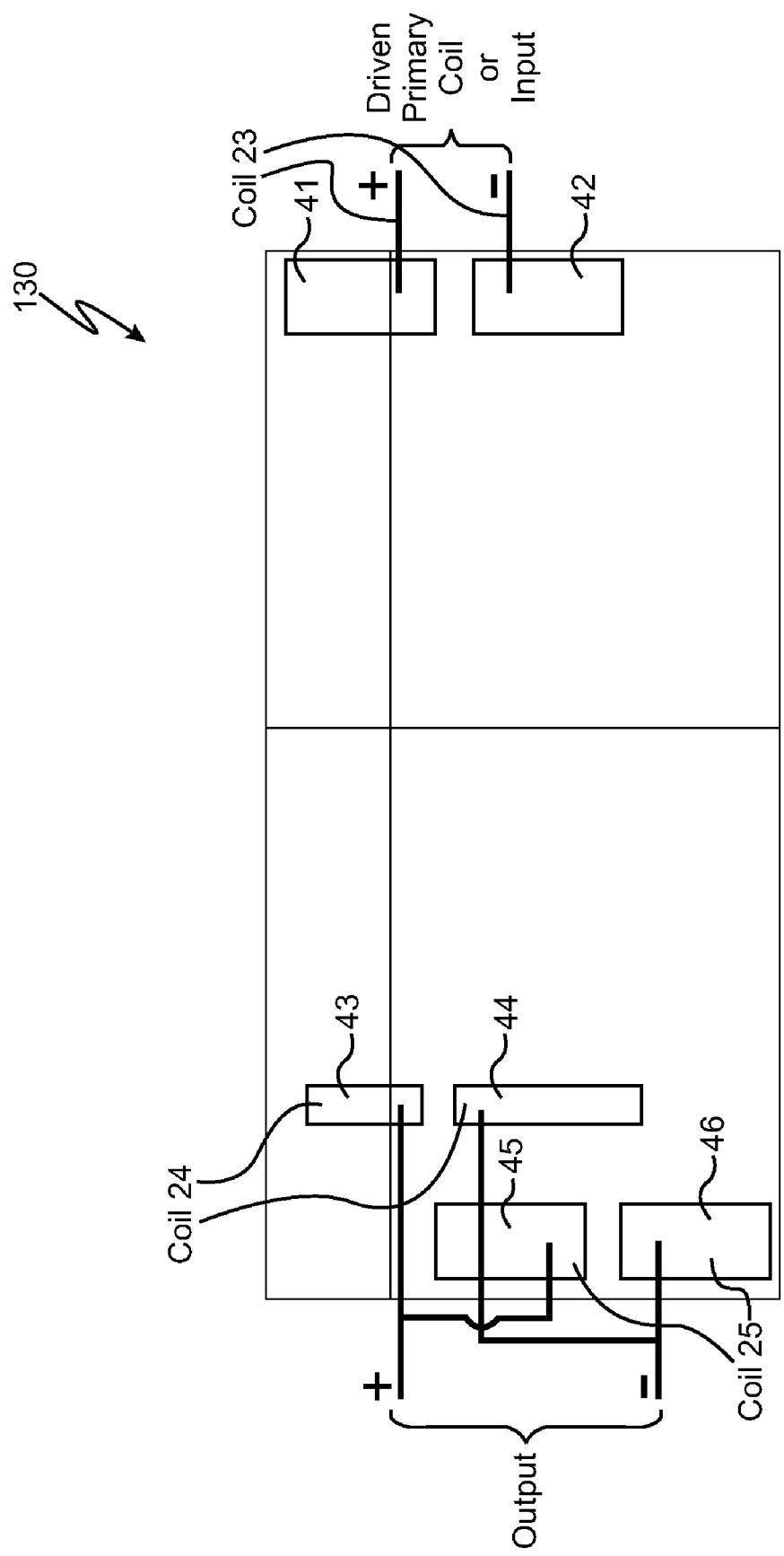
FIG. 9 shows yet another embodiment of outputs connected in parallel for a three-coil compact power transformer 130.

FIG. 9 shows another embodiment of outputs connected in parallel for a three-coil compact power transformer 130, where the high side of coil 24 is connected to the high side of coil 25, and where the two low sides of coils 24 and 25 are also connected to one another. In such an embodiment, a single impedance matching circuit 140 may be employed.

Note that included within the scope of the present invention are methods of making and having made the various components, devices and systems described herein.

The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

I claim:

1. A power transformer, comprising:
   first and second electrically insulating solid non-glass substrates comprising an electrically insulating, non-metallic, non-semiconductor low dielectric loss material, each substrate comprising opposing upper and lower surfaces;
   a power amplifier circuit configured to receive an input DC power signal and convert the DC power signal into an AC power signal;
   a first transmitting coil disposed upon or in the upper surface of the first substrate;
   a second receiving coil disposed upon or in the lower surface of the first substrate;
   a third receiving coil disposed upon or in the lower surface of the second substrate;
   an input impedance matching circuit having a first input operably connected to the power amplifier circuit, and a first output operably connected to the first coil, the input impedance matching circuit being configured to match a first impedance of the first coil to an impedance of the power amplifier circuit; and
   an output impedance matching circuit having second inputs operably connected to the second and third coils, and further comprising a second output, the output impedance matching circuit being configured to match an impedance of the second and third coils to a second impedance of an output circuit operably connected to the second output;
   wherein the first coil is separated from the second coil by at least portions of the first substrate, the first and second coils are spatially arranged and configured respecting one another such that the AC power signals may be transmitted by the first coil to the second coil across a dielectric barrier comprising the non-semiconductor low dielectric loss material disposed therebetween, such material including at least portions of the first substrate;
   wherein the first coil is separated from the third coil by at least portions of the second substrate, the first and third coils are spatially arranged and configured respecting one another such that the AC power signals may be transmitted by the first coil to the third coil across a dielectric barrier comprising the non-semiconductor low dielectric loss material disposed therebetween, such material including at least portions of the second substrate, and further wherein each of the first and second substrates has a thickness between upper and lower surfaces thereof ranging between about 0.5 mils and about 25 mils, between about 1 mil and about 25 mils, or between about 1.5 mils and about 25 mils.

2. The power transformer of claim 1, wherein the first and second substrates are generally planar.

3. The power transformer of claim 1, wherein the first and second substrates have a dielectric loss tangent at room temperature that is less than or equal to 0.05.

4. The power transformer of claim 1, wherein the first and second substrates have a dielectric loss tangent at room temperature that is less than or equal to 0.03.

5. The power transformer of claim 1, wherein the first and second dielectric barriers each exceed about 1 mil in thickness.

6. The power transformer of claim 1, wherein a breakdown voltage between the first coil and the second coil, or between the first coil and the third coil, exceeds about 2,000 volts RMS.

7. The power transformer of claim 1, wherein the power amplifier circuit is a Class E amplifier circuit.

8. The power transformer of claim 1, wherein the output circuit comprises a rectifier and a low-pass filter.

9. The power transformer of claim 1, wherein the output circuit comprises a voltage controller circuit.

10. The power transformer of claim 1, wherein the output circuit comprises a converter circuit.

11. The power transformer of claim 1, wherein the AC power signal has a frequency ranging between 9 MHz and 1.1 GHz.

12. The power transformer of claim 1, wherein the substrate material further comprises a material selected from the group consisting of one or more of beryllium, fiberglass, glass, ceramic, polyimide, polyimide film, a polymer, an organic material, a flex circuit material, epoxy, epoxy resin, a printed circuit board material, PTFE and glass, PTFE and ceramic, PTFE, glass and ceramic, plastic and thermoset plastic.

13. The power transformer of claim 1, wherein the power coil transformer comprises a plurality of layers in addition to the first and second substrates, at least one of the layers comprising the low dielectric loss material.

14. The power transformer of claim 1, wherein the breakdown voltage between the first coil and the second coil, or between the first coil and the third coil, exceeds about 2,000 volts RMS when applied over a time period of about one minute, exceeds about 2,000 volts RMS when applied over a time period of about six minutes, or exceeds about 2,000 volts RMS when applied over a time period of 24 hours.

15. The power transformer of claim 1, wherein the breakdown voltage between the first coil and the second coil, or between the first coil and the third coil, exceeds about 5,000 volts RMS when applied over a time period of about one minute, exceeds about 5,000 volts RMS when applied over a time period of about six minutes, or exceeds about 5,000 volts RMS when applied over a time period of 24 hours.

* * * * *